United States Patent
Jordan et al.

(10) Patent No.: US 6,701,484 B1
(45) Date of Patent: Mar. 2, 2004

(54) REGISTER FILE WITH DELAYED PARITY CHECK

(75) Inventors: Paul Joseph Jordan, Austin, TX (US); Peter Juergen Klim, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 396 days.

(21) Appl. No.: 09/635,456

(22) Filed: Aug. 11, 2000

(51) Int. Cl.[7] ............... G06F 11/00; G11C 29/00
(52) U.S. Cl. ............................... 714/801; 714/718
(58) Field of Search ............................... 714/800, 763, 714/805, 718, 719, 812, 814, 748, 749, 701, 801, 799

(56) References Cited

U.S. PATENT DOCUMENTS

| | | | | |
|---|---|---|---|---|
| 4,392,162 A | * | 7/1983 | Yamamoto | 386/81 |
| 5,301,156 A | * | 4/1994 | Talley | 365/201 |
| 5,308,918 A | * | 5/1994 | Yamauchi et al. | 84/622 |
| 6,052,773 A | * | 4/2000 | DeHon et al. | 712/43 |
| 6,317,819 B1 | * | 11/2001 | Morton | 712/22 |
| 6,370,668 B1 | * | 4/2002 | Garrett et al. | 714/763 |

* cited by examiner

*Primary Examiner*—Albert Decady
*Assistant Examiner*—Cynthia Butt
(74) *Attorney, Agent, or Firm*—Anthony V. S. England; Bracewell & Patterson, L.L.P.

(57) ABSTRACT

A register for a computer processor removes the parity check from the critical path of CPU operation, and delays the parity check to the next immediate clock cycle. The register has a memory array, and read and write decoders for accessing the memory array using select lines. The select lines are also connected to read and write address latches which are used to index a parity bit array. When a value is written to, or read from, the memory array, its corresponding parity bit is calculated and either stored in the parity bit array (for a write operation), or compared to an existing parity bit array entry (for a read operation). The parity check is performed on a copy of the value contained in a read data latch or a write data latch. Each data latch has an input connected to a respective read or write port of the memory array. The latches delay the parity check by only one cycle.

18 Claims, 12 Drawing Sheets

REGISTER FILE WITH DELAYED PARITY CHECK

BACKGROUND OF THE INVENTION

1. Field of the Invention

The present invention generally relates to computer systems, particularly to error detection methods such as parity checking, and more specifically to a method of checking parity within register files without significantly impacting access time.

2. Description of Related Art

The basic structure of a conventional computer system includes one or more processing units connected to various input/output devices for the user interface (such as a display monitor, keyboard and graphical pointing device), a permanent memory device (such as a hard disk, or a floppy diskette) for storing the computer's operating system and user programs, and a temporary memory device (such as random access memory or RAM) that is used by the processor(s) in carrying out program instructions. The evolution of computer processor architectures has transitioned from the now widely-accepted reduced instruction set computing (RISC) configurations, to so-called superscalar computer architectures, wherein multiple and concurrently operable execution units within the processor are integrated through a plurality of registers and control mechanisms.

An illustrative embodiment of a conventional processing unit is shown in FIG. 1, which depicts the architecture for a PowerPC™ microprocessor 12 manufactured by International Business Machines Corp. Processor 12 operates according to reduced instruction set computing (RISC) and is a single integrated circuit superscalar microprocessor. The system bus 20 is connected to a bus interface unit (BIU) 30 of processor 12. Bus 20, as well as various other connections described, include more than one line or wire, e.g., the bus could be a 32-bit bus. BIU 30 is connected to an instruction cache 32 and a data cache 34. The output of instruction cache 32 is connected to a sequencer unit 36. In response to the particular instructions received from instruction cache 32, sequencer unit 36 outputs instructions to other execution circuitry of processor 12, including six execution units, namely, a branch unit 38, a fixed-point unit A (FXUA) 40, a fixed-point unit B (FXUB) 42, a complex fixed-point unit (CFXU) 44, a load/store unit (LSU) 46, and a floating-point unit (FPU) 48.

The inputs of FXUA 40, FXUB 42, CFXU 44 and LSU 46 also receive source operand information from general-purpose registers (GPRs) 50 and fixed-point rename buffers 52. The outputs of FXUA 40, FXUB 42, CFXU 44 and LSU 46 send destination operand information for storage at selected entries in fixed-point rename buffers 52. CFXU 44 further has an input and an output connected to special-purpose registers (SPRs) 54 for receiving and sending source operand information and destination operand information, respectively. An input of FPU 48 receives source operand information from floating-point registers (FPRs) 56 and floating-point rename buffers 58. The output of FPU 48 sends destination operand information to selected entries in rename buffers 58. Processor 12 may include other registers, such as configuration registers, memory management registers, exception handling registers, and miscellaneous registers, which are not shown. Processor 12 carries out program instructions from a user application or the operating system, by routing the instructions and data to the appropriate execution units, buffers and registers, and by sending the resulting output to the system memory device (RAM), or to some output device such as a display console.

A high-level schematic diagram of a typical general-purpose register 50 is further shown in FIG. 2. GPR 50 has a block 60 labeled "MEMORY_ARRAY_80×64," representing a register file with 80 entries, each entry being a 64-bit wide word. Blocks 62a (WR0_DEC) through 62d (WR3_DEC) depict address decoders for each of the four write ports 64a–64d, that is, decoder 62a (WR0_DEC, or port 0) receives the 7-bit write address wr0_addr<0:6> (write port 64a). The 7-bit write address for each write port is decoded into 80 select signals (wr0_sel<0:79> through wr3_sel<0:79>). Write data inputs 66a–66d (wr0_data<0:63> through wr3_data<0:63>) are 64-bit wide data words belonging to ports 0 through 3 respectively. The corresponding select line 68a–68d for each port (wr0_sel<0:79> through wr3_sel<0:79>) selects the corresponding 64-bit entry inside array 60 where the data word is stored.

There are five read ports in this particular prior art GPR. Read ports 70a–70e (0 through 4) are accessed through read decoders 72a–72e (RD0_DEC through RD4_DEC), respectively. Select lines 74a–74e (rd0_sel<0:79> through rd4_sel<0:79>) for each decoder are generated as described for the write address decoders above. Read data for each port 76a–76e (rd0_data<0:63> through rd4_data<0:63>) follows the same format as the write data. The data to be read is driven by the content of the entry selected by the corresponding read select line.

Various error detection methods have been devised to ensure that data is properly transferred between system components. The two most common methods are parity checks and error-correction codes (ECC's). Parity checks, in their most simple form, constitute an extra bit that is appended to a binary value when it is to be transmitted to another component. The extra bit represents the binary modulus (i.e., 0 or 1) of the sum of all bits in the binary value. In this manner, if one bit in the value has been corrupted, the binary modulus of the sum will not match the setting of the parity bit. If, however, two bits have been corrupted, then the parity bit will match, falsely indicating a correct parity. In other words, a simple parity check will detect only an odd number of incorrect bits (including the parity bit itself). Similar error detection methods have been devised, such as cyclic redundancy checking (CRC).

ECC's can further be used to reconstruct the proper data stream. Some error correction codes can only be used to detect single-bit errors; if two or more bits in a particular memory word are invalid, then the ECC might not be able to determine what the proper data stream should actually be. Other ECC's are more sophisticated and allow detection or correction of double errors, and some ECC's further allow the memory word to be broken up into clusters of bits, or "symbols," which can then be analyzed for errors in even more detail.

These error detection techniques are implemented at all levels of a computer system. For example, a magnetic disk (permanent memory device) typically records not only information that comprises data to be retrieved for processing (the memory word), but also records an error-correction code for each file, which allows the processor, or a controller, to determine whether the data retrieved is valid. ECC's are also used with temporary memory devices, e.g., DRAM or cache memory devices, and the ECC for files stored in DRAM can be analyzed by a memory controller which provides an interface between the processor and the DRAM array. If a memory cell fails during reading of a particular memory word (due to, e.g., stray radiation, electrostatic discharge, or a defective cell), then the failure can at least be detected so that further action can be taken.

Parity checking might additionally be applied to processor core registers, such as the general-purpose, special-purpose, or floating-point registers of FIG. 1, but parity checking at this level can significantly decrease processor performance. Parity checking adds complexity in the critical path of processor operation. In other words, whether the value is being read from or written to the register, the parity check logic must first operate on the transmitted value before processing may continue. Placement of the parity checking logic within the critical path of register access thus stalls operation of the computer system at the most basic level. The delays can become considerable given the relative number of register accesses that are necessary to complete even a simple operation. It would, therefore, be desirable to devise a parity checking method for register files which did not significantly impact the register access time. It would be further advantageous if the method minimized any delay in detecting parity errors, so that remedial action could immediately be taken.

SUMMARY OF THE INVENTION

It is therefore one object of the present invention to provide for improved error detection in a computer system.

It is another object of the present invention to provide a method of parity checking for register files without impacting access time.

It is yet another object of the present invention to provide such a method which may take advantage of available register clocking schemes.

The foregoing objects are achieved in a register for storing values used by a data processor, generally comprising a memory array for storing a plurality of values, means for accessing a given value in the array during a first clock cycle, and means for checking for errors in the given value during a second clock cycle immediately following the first clock cycle. The array has a plurality of write ports, a plurality of read ports, a plurality of write select lines used to temporarily assign a given one of the write ports to a particular entry, and a plurality of read select lines used to temporarily assign a given one of the read ports to a particular entry. The accessing means includes a plurality of write decoders connected, respectively, to the write select lines, and a plurality of read decoders connected, respectively, to the read select lines. Each of the write decoders has one input connected to a first system clock, each of the read decoders has one input connected to a second system clock which may be an inverted signal of the first system clock. The checking means includes a parity array having a plurality of single-bit entries corresponding, respectively, to entries of the memory array. The accessing means writes the given value to the memory array, or reads it from the memory array, and the checking means sets a data latch to the given value, and calculates a parity bit for the value in the data latch. Read and write address latches have inputs connected to a respective read or write select line of the memory array. The latches delay the parity check by only one cycle. In this manner, the parity check is taken out of the critical path of the CPU. In other words, the parity check is performed in parallel with the register file access, rather than postponing the access until the parity check is completed.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein:

DESCRIPTION OF AN ILLUSTRATIVE EMBODIMENT

Figure 3A:
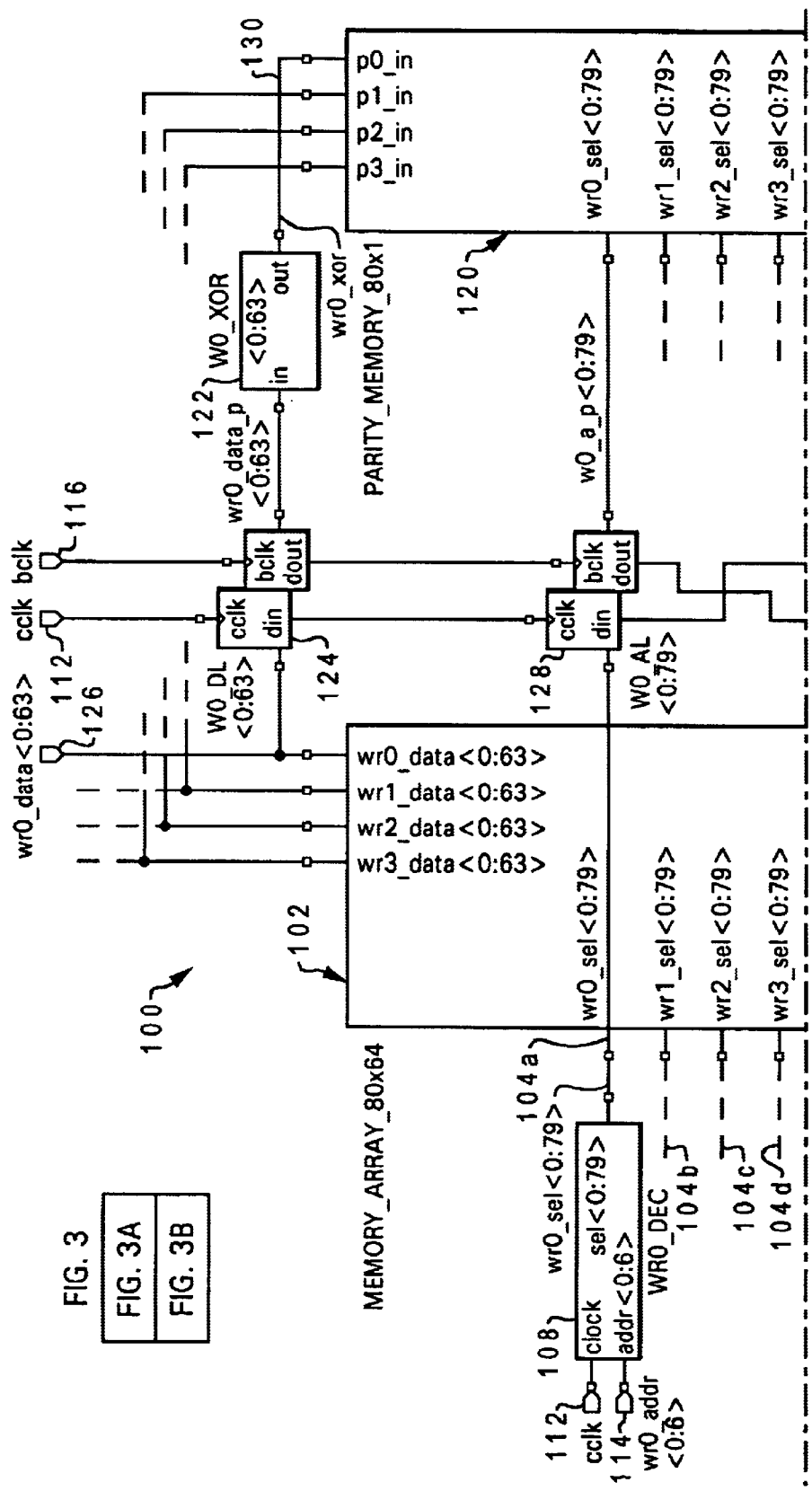
FIG. 3 is a high-level schematic diagram of one embodiment of a processor register constructed in accordance with the present invention.
Figure 3B:
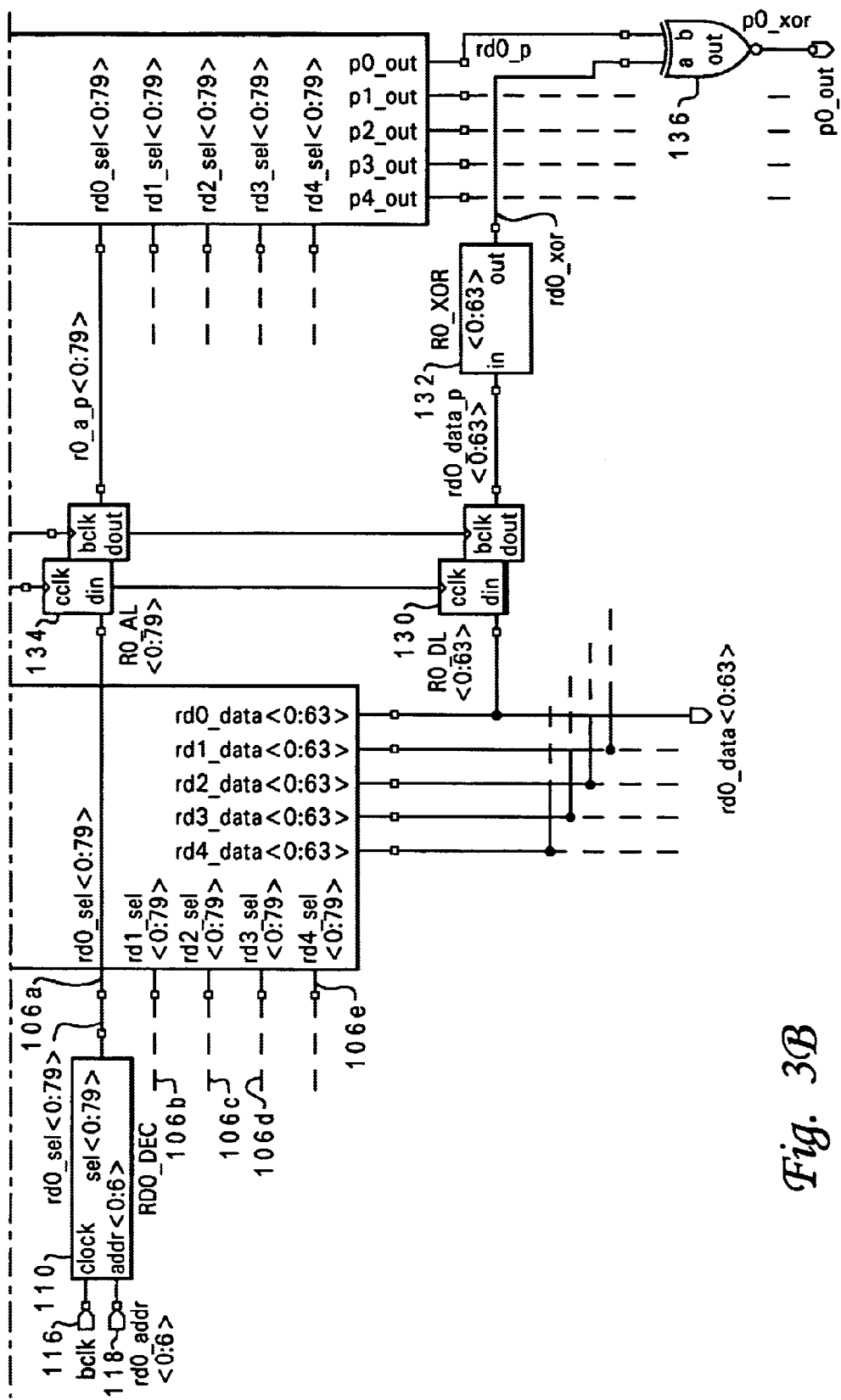
Figure 5:
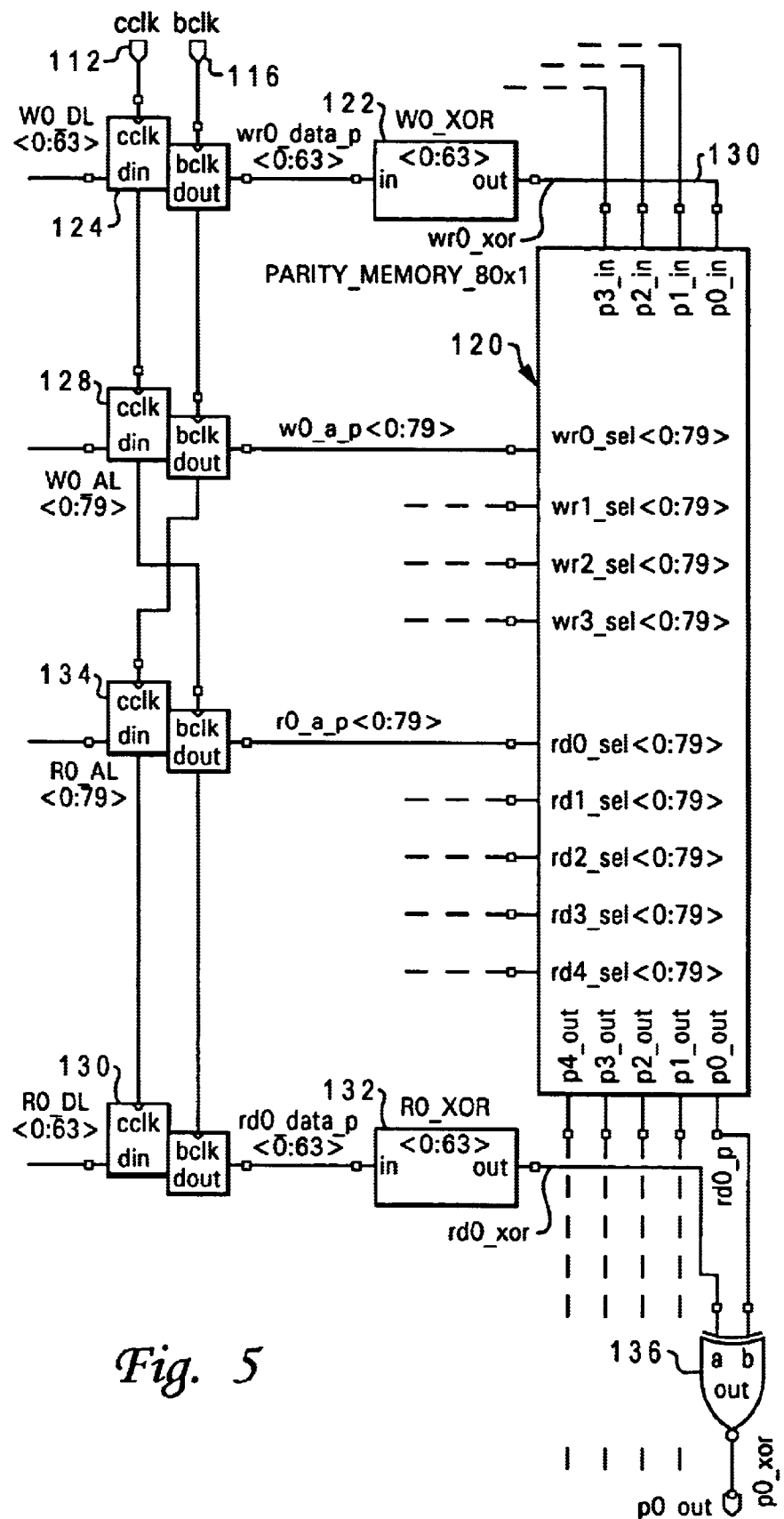
FIG. 5 is a high-level schematic diagram of one embodiment of a parity checking circuit for a processor register constructed in accordance with the present invention.

With reference now to FIG. 3, there is depicted one embodiment 100 of a processor register file having delayed parity checking, constructed in accordance with the present invention. FIG. 5 depicts a high-level schematic diagram of the parity checking circuit for the processor register depicted in FIG. 3. Register file 100 has several elements which are found in conventional registers, including a register file array 102 ("MEMORY_ARRAY_80×64") having a plurality of write select lines 104a–104d, and a plurality of read select lines 106a–106e. Each of these select lines is connected to a respective decoder; for simplicity, only one write decoder 108 (WR0_DEC) and one read decoder 110 (RD0_DEC) are shown. Those skilled in the art will appreciate that register file 100 may be used in various fashions, such as a general-purpose register, a special-purpose register, or a floating-point register. The register may hold various values, i.e., both operand data and program instructions.

Figure 1:
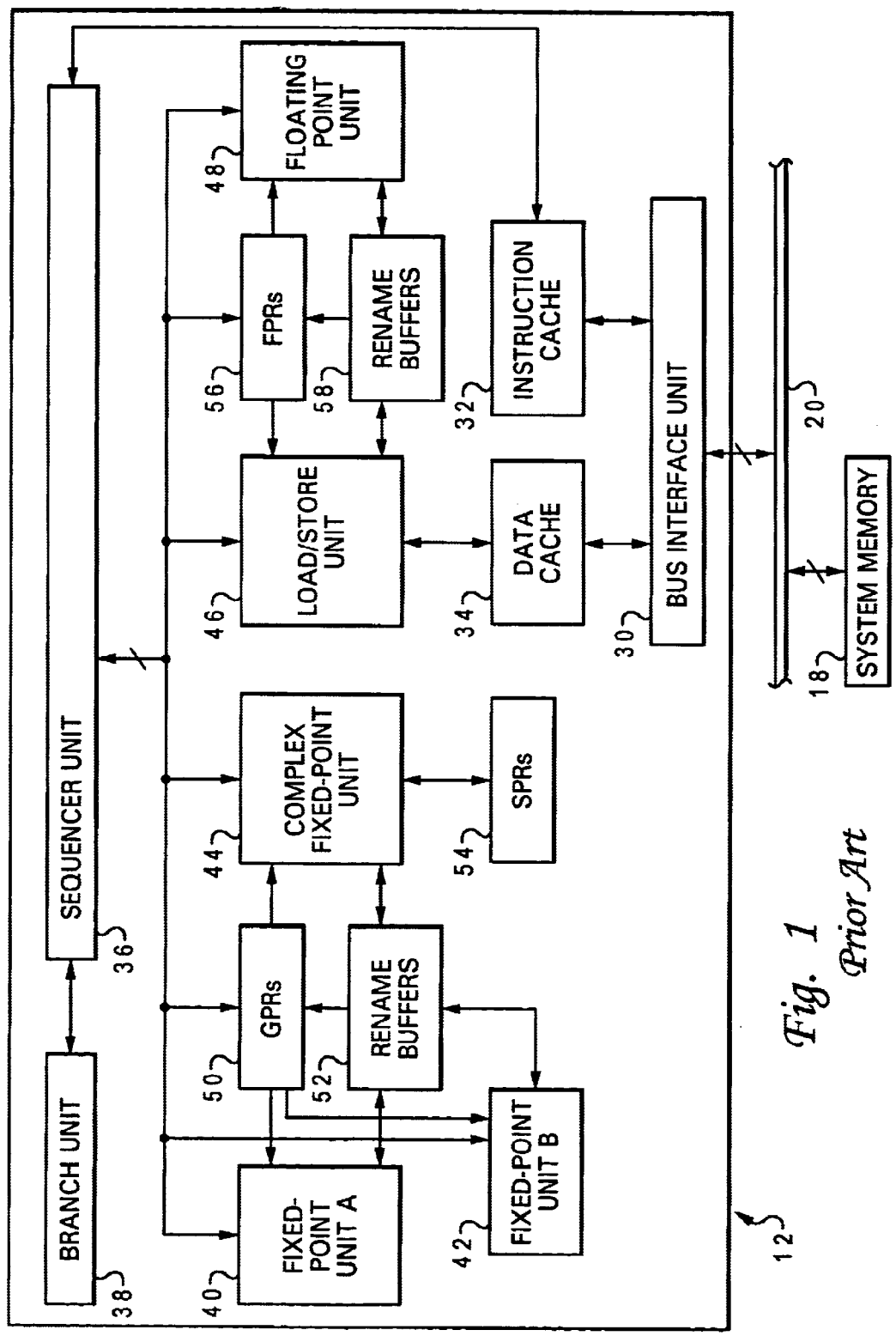
FIG. 1 is a block diagram of a conventional computer processor, depicting various execution units, buffers, caches, and registers.
Figure 2A:
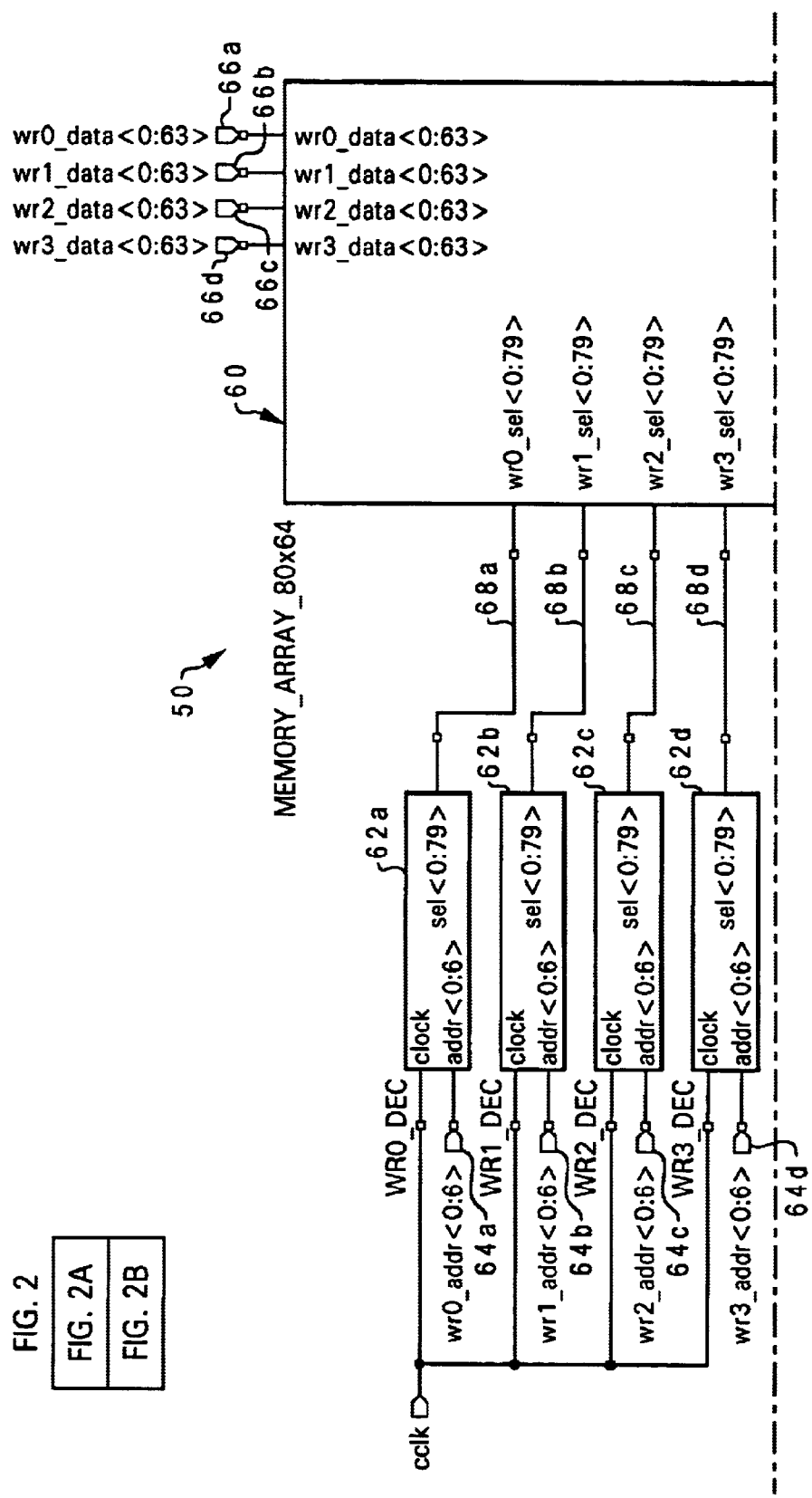
FIG. 2 is a high-level schematic diagram of a general purpose register such as that shown in FIG. 1.
Figure 2B:
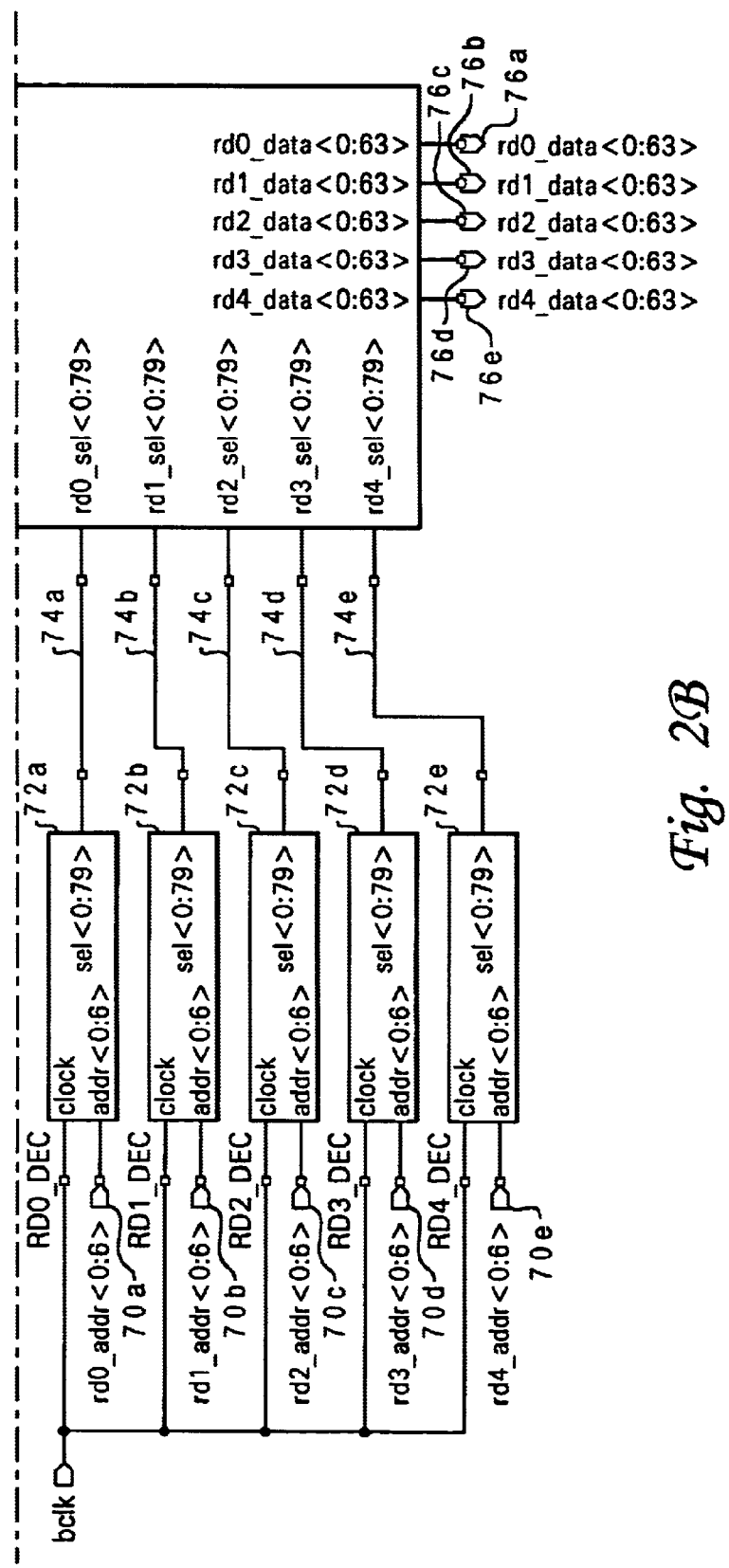

All array functions for register file array 102, such as write data and address, and read data and address, generally operate as described for FIG. 2. The present invention, however, adds a parity checking feature, without altering the operation of the register file. As will become apparent, the extra circuitry used to achieve parity checking is not located in the critical path of the central processing unit (CPU).

The protocol for the operation of register file 100 may be described as "write-through," meaning that data is written in the first half of the system clock cycle, and read during the second half. Thus, data written to a specific entry of any write port in the first half of the clock cycle is available for reading by any read port in the second half of the same clock cycle. The clocking scheme of choice for this discussion utilizes two out-of-phase clocks. The system clock is labeled "cclk" and its positive transition signals the beginning of the clock cycle. The second clock, called "bclk," is essentially an inverted cclk, and its falling edge signals the end of the clock cycle. For this discussion it is assumed that the transitions of the cclk and bclk coincide. Since the write-through method is used it is convenient to perform the write operation when the cclk transitions high, and to perform the read operation when the bclk transitions high. Accordingly, write decoder 108 has as its inputs the cclk signal 112 and a write address line 114, while read decoder 110 has as its inputs the bclk signal 116 and a read address line 118. This clock scheme is used throughout this discussion, but the invention is not limited to this or any specific clock scheme.

The parity checking circuitry required by this invention is identical for each read or write port. Hence, it is sufficient to describe write port 0 and read port 0 only. The invention is applicable to register files with any number of read and write ports.

The parity checking circuitry includes a memory array 120 labeled "PARITY_MEMORY_80×1." Array 120 contains 80 1-bit entries, and is used to store the parity bit of each of the corresponding 80 entries in register file 102. Block 122 (WR0_XOR) contains a 64-way exclusive OR (XOR) gate. A latch 124 (W0_DL<0:63>) is used to hold the write data. Latch 124 is a level-sensitive, master-slave type where the master flip-flop is clocked by cclk signal 112 and the slave is clocked by bclk 116.

Figure 4A:
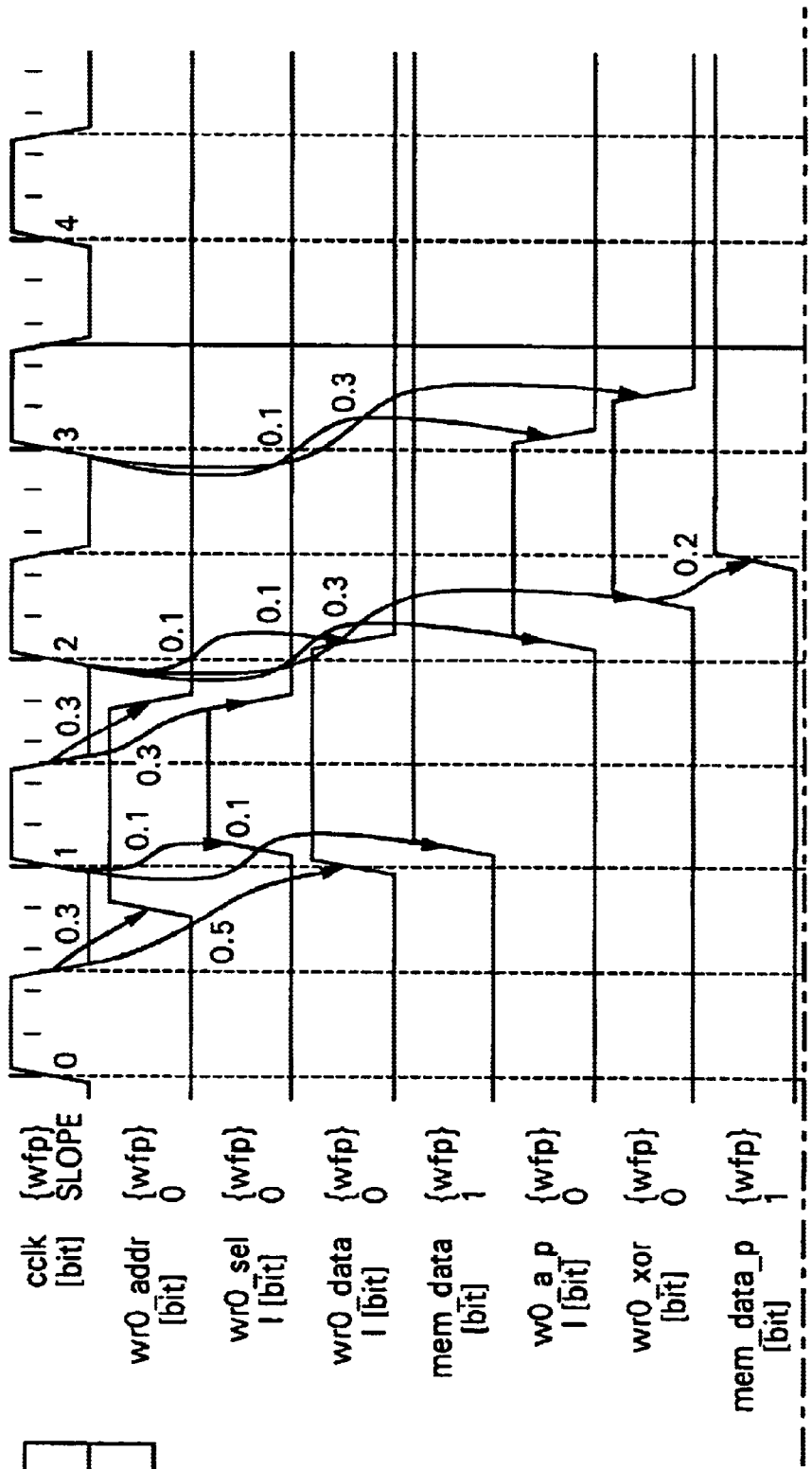
FIG. 4 is a timing diagram illustrating the interrelationships of the various signals in the parity checking circuit of FIG. 3.
Figure 4B:
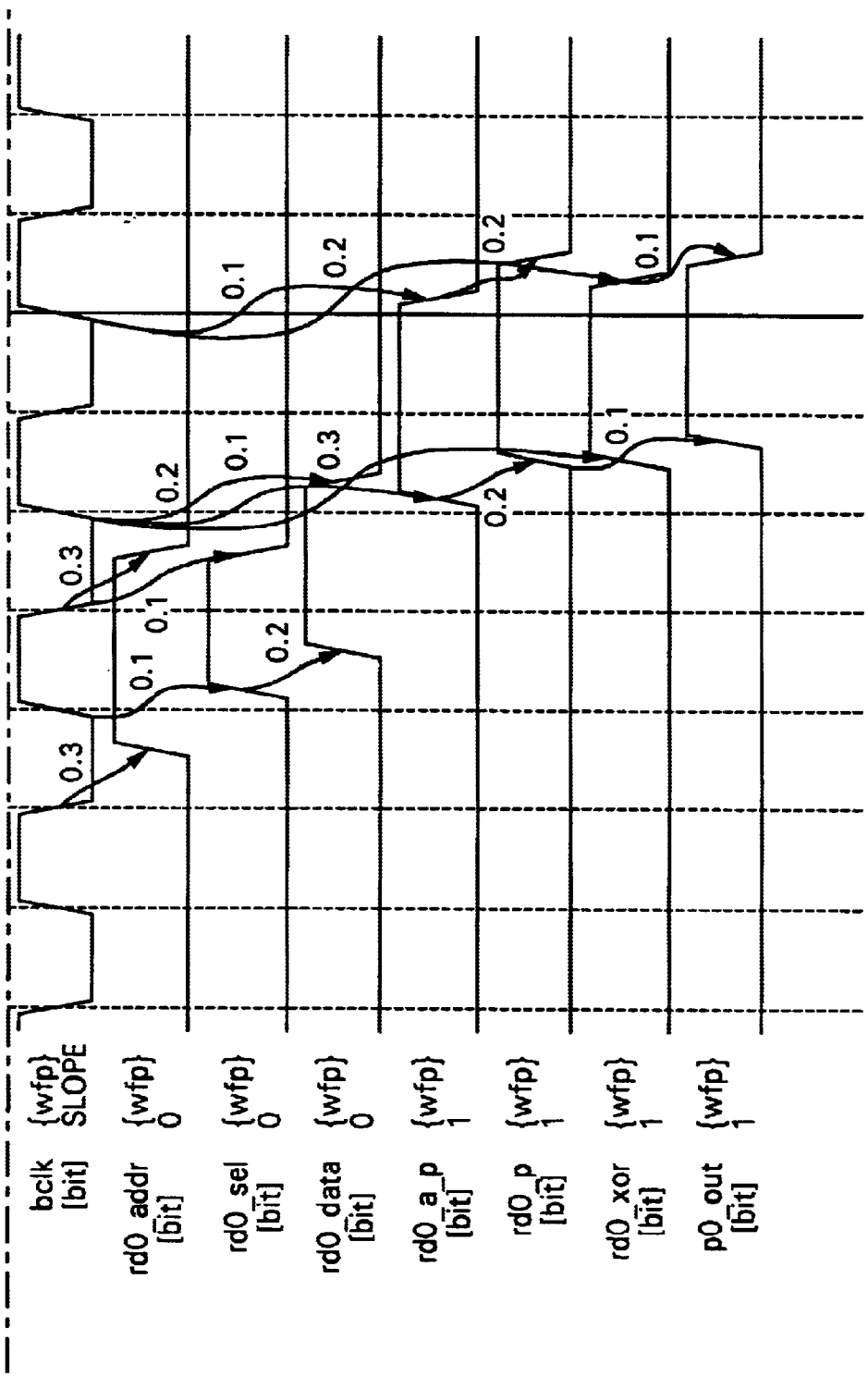

The operation of the parity checking circuitry may be further understood with reference to the timing diagram of FIG. 4. At the beginning of the clock cycle, cclk goes high and write data line 126 (wr0_data<0:63>) becomes valid. The access request, in this case write address (wr0_addr<0:6>) from line 114, was issued during the second half of the previous clock cycle, that is while bclk was high. Write address decoder 108 (WR0_DEC) selects the corresponding one out of 80 entries in register file array 102, for example, entry number 8. To generate the corresponding select line wr0_sel<8>, write decoder 108 combines the decoded signal with the cclk signal in a logical AND fashion, and delays the falling edge such that it may be latched by another master-slave latch 128 W0_AL<8>.

The signal labeled "mem_data" in FIG. 4 is the data actually stored in the memory cells of register file array 102. Latch 124 (W0_DL<0:63>) shifts the write data of the current cycle by a complete cycle due to the master-slave action of the latch. Likewise the corresponding decoded write address w0_sel<8> is latched and shifted by one cycle, as well as restored to full cycle length to form w0_a_p<8>. Signal w0_a_p<8> is the write select signal for entry 8 in parity memory array 120. The cycle-shifted wr0_data_p<0:63> is fed to 64-way XOR gate 122. The single output (the parity bit) from gate 122 is now written into entry 8 of PARITY_MEMORY_80×1. Due to the extra delay through the 64-way XOR circuit, write select line 130 (wr0_xor) does not need to be combined (logically ANDed) with cclk, as may be observed in the timing diagram. Thus, data is written in register 100 during one cycle, and the corresponding parity bit is written into the parity memory array one cycle immediately thereafter. Error checking may be implemented for write operations by comparing a provided parity bit against the parity bit generated by XOR gate 122.

Read addresses are issued at the beginning of the write cycle. Read decoder 110 operates in a manner essentially identical to write decoder 108, with regard to the parity checking. Read decoder 110 selects one entry (e.g., entry 8), combines it in a logical AND fashion with bclk (instead of cclk), and delays the falling of rd0_sel<8>. Hence, the actual read operation is performed in the second half of the system clock cycle. The content of memory entry 8 is driven out as rd0_data<0:63> when rd0_sel<8> goes high. The output data (rd0_data<0:63>) is cycle-shifted into the second half of the following cycle by bclk clocking the master and cclk clocking the slave of latch 130 (R0_DL<0:63>). Another 64-way XOR gate 132 (R0_XOR) generates the single output (parity bit) rd0_xor. Read select rd0_sel<8> is cycle shifted into the second half of the following cycle as well by latch 134, forming signal r0_a_p<8>, the select for the parity memory array entry 8. The final output, p0_out is the exclusive OR of the parity array output rd0_p and rd0_xor (using XOR gate 136), and is one complete cycle delayed from rd0_data. So, the parity bit is read one cycle after the register file data was read.

The present invention thus solves the problem of parity checking within register files without impacting the access time significantly. The parity check is delayed by only one clock cycle, to minimize any concomitant delay that might arise if a parity error is detected. If an error is detected, then register file 100 can back up and repeat the access based on, e.g., the error signal from XOR gate 136. Of course, the use of parity checkers which are outside of the critical path in this manner will result in further delays if an error if found to have occurred, but this situation is the exception.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. It is therefore contemplated that such modifications can be made without departing from the spirit or scope of the present invention as defined in the appended claims.

Figures 6, 7, 8:
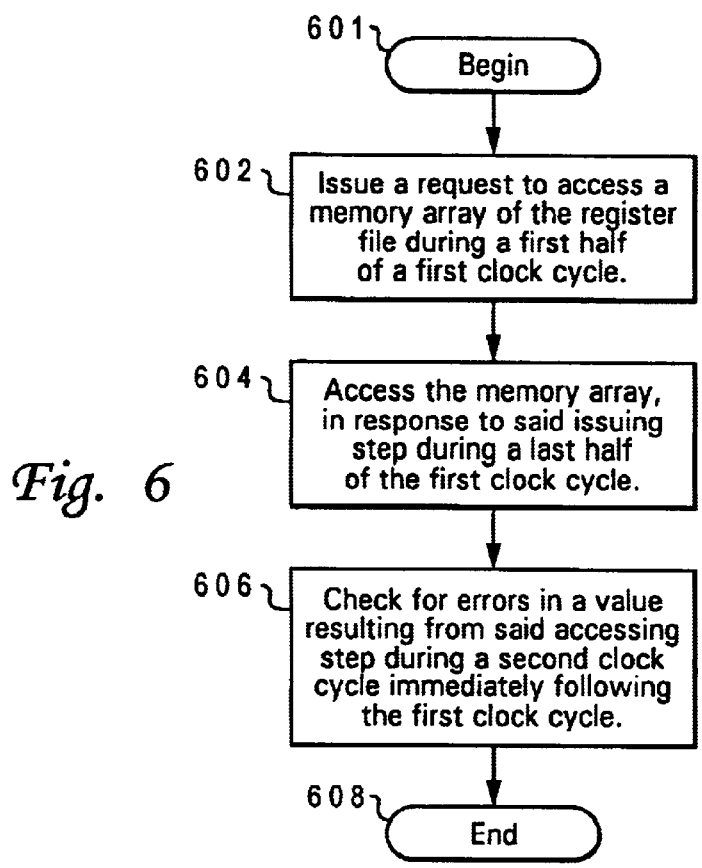
FIG. 6 is a flow diagram illustrating a method of detecting errors and values stored in a register file of a computer processor, in accordance with the preferred embodiment of the present invention.
FIG. 7 is a flow diagram illustrating a method of detecting errors and values stored in a register file of a computer processor, in accordance with the preferred embodiment of the present invention.
FIG. 8 is a flow diagram illustrating a method of detecting errors and values stored in a register file of a computer processor, in accordance with the preferred embodiment of the present invention.

With reference now to FIG. 6, there is shown a flow diagram illustrating the method of detecting errors and values stored in a register file of a computer processor, in accordance with a preferred embodiment of the present invention. FIG. 6 shows the process 600 and begins at step 602 and proceeds to step 604, by issuing a request to access a memory array of the register file, during a first half of a first clock cycle at step 606; accessing the memory array, in response to said issuing step, during a last half of the first clock cycle; and at step 608 checking for errors in a value resulting from said accessing step, during a second clock cycle immediately following the first clock cycle.

With reference to FIG. 7, there is shown a process 700 having a step 702, included in the checking step 606 wherein, the checking step occurs during a first half of the second clock cycle.

As seen in FIG. 8, there is shown a process 800, having a step 802, wherein said checking step 606 determines that an error is present in the value; and at step 804, re-issues the request in response to said determination.

Figure 9:
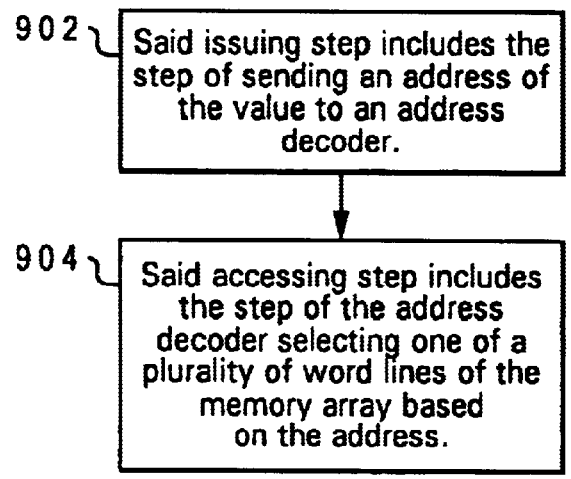
FIG. 9 is a flow diagram illustrating a method of detecting errors and values stored in a register file of a computer processor, in accordance with the preferred embodiment of the present invention.

In FIG. 9 a process 900 is shown which includes step 902 wherein said issuing step 602 includes the step of sending an address of the value to an address decoder; and step 904 wherein said accessing step 604 includes the step of the address decoder selecting one of a plurality of word lines of the memory array based on the address.

Figure 10:
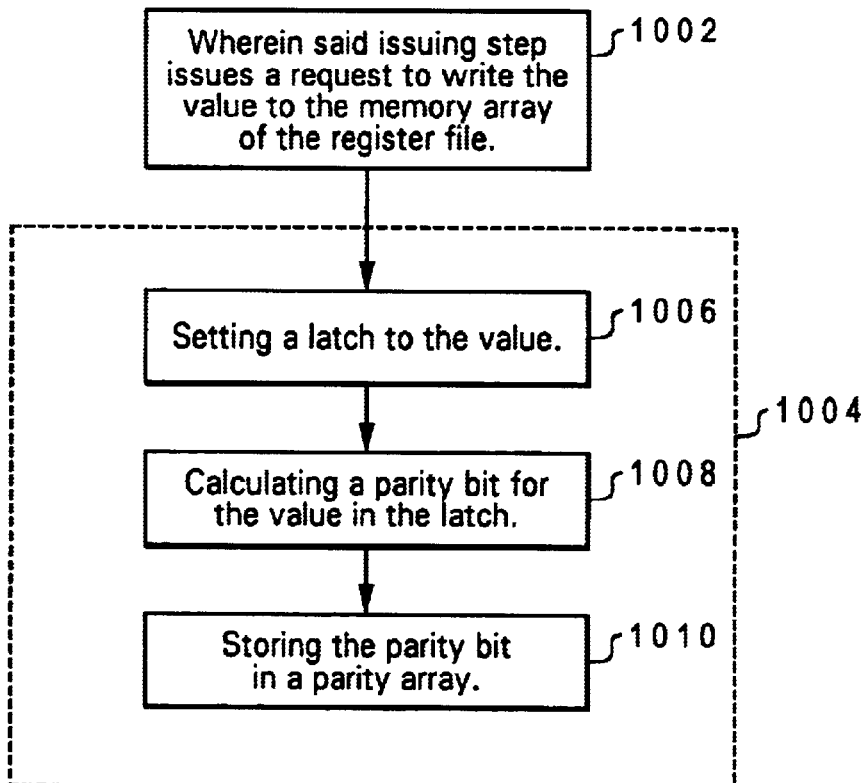
FIG. 10 is a flow diagram illustrating a method of detecting errors and values stored in a register file of a computer processor, in accordance with the preferred embodiment of the present invention.

In FIG. 10 is shown a process 1000 which includes step 1002 wherein said issuing step 602 issues a request to write the value to the memory array of the register file and comprises steps 1004, including step 1006 of setting a latch to the value, step 1008 calculating a parity bit for the value in the latch; and step 1010 storing the parity bit in a parity array.

Figure 11:
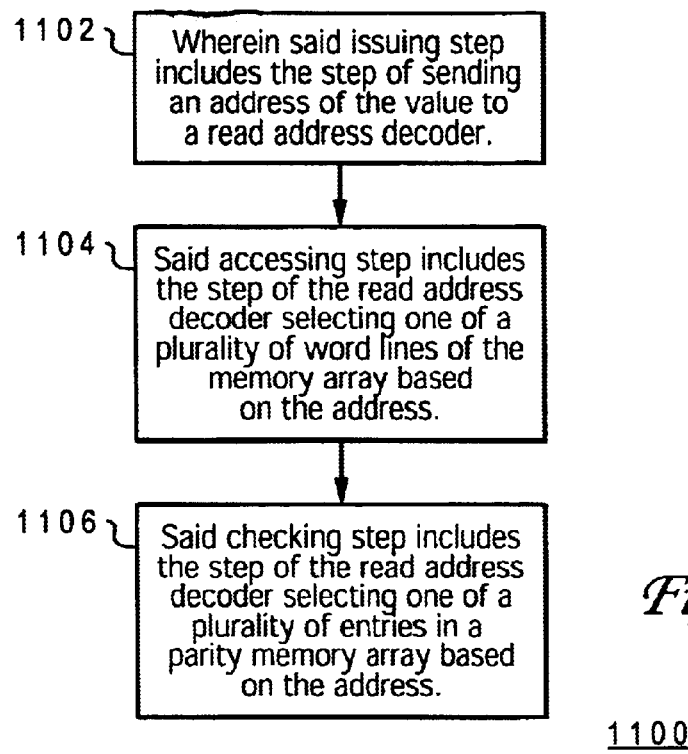
FIG. 11 is a flow diagram illustrating a method of detecting errors and values stored in a register file of a computer processor, in accordance with the preferred embodiment of the present invention.

In FIG. 11 is shown a process 1100 which includes step 1102 wherein said issuing step 602 includes the step of sending an address of the value to a write address decoder; step 1104 wherein said accessing step 604 includes the step of the write address decoder selecting one of a plurality of word lines of the memory array based on the address; and step 1106 wherein said checking step 606 includes the step of the write address decoder selecting one of a plurality of entries in a parity memory array based on the address.

Figure 12:
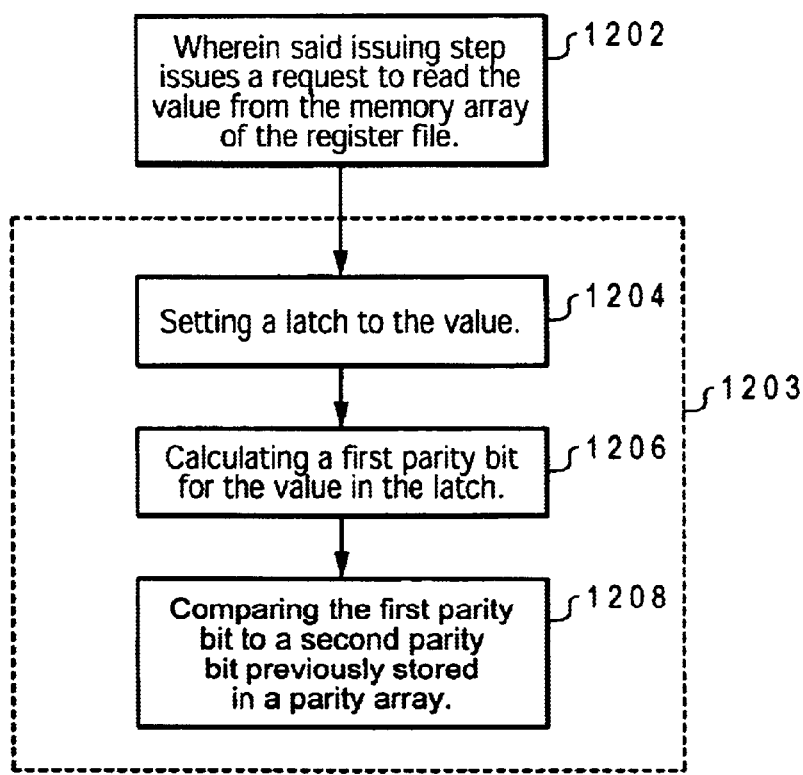
FIG. 12 is a flow diagram illustrating a method of detecting errors and values stored in a register file of a computer processor, in accordance with the preferred embodiment of the present invention.

As seen in FIG. 12 there is shown a process 1200 which includes step 1202 wherein said issuing step 602 issues a request to read the value from the memory array of the register file and comprises steps 1203; including step 1204 setting a latch to the value; step 1206 calculating a first parity bit for the value in the latch; and step 1208 comparing the first parity bit to a second parity bit previously stored in a parity array.

Figure 13:
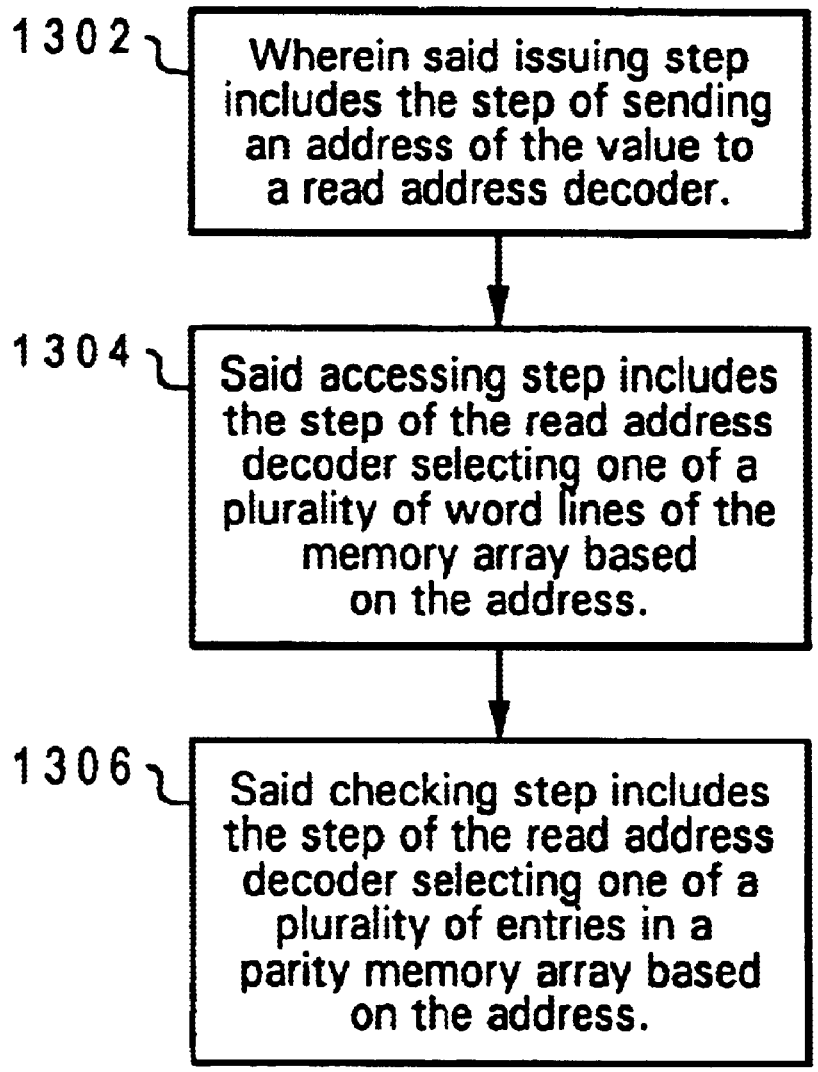
FIG. 13 is a flow diagram illustrating a method of detecting errors and values stored in a register file of a computer processor, in accordance with the preferred embodiment of the present invention.

As seen in FIG. 13 there is shown a process 1300 which includes step 1302 wherein said issuing step 602 includes the step of sending an address of the value to a read address decoder; step 1304 wherein said accessing step 604 includes the step of the read address decoder selecting one of a plurality of word lines of the memory array based on the address; and step 1306 wherein said checking step 606 includes the step of the read address decoder selecting one of a plurality of entries in a parity memory array based on the address.

What is claimed is:

1. A method of detecting errors in values stored in a register file of a computer processor, the method comprising the steps of:

issuing a request to access a memory array of the register file, during a first half of a first clock cycle;

accessing the memory array, in response to said issuing step, during a last half of the first clock cycle; and checking for errors in a value resulting from said accessing step, during a second clock cycle immediately following the first clock cycle.

2. The method of claim 1 wherein said checking step occurs during a first half of the second clock cycle.

3. The method of claim 1 wherein said checking step determines that an error is present in the value, and further comprising the step of re-issuing the request in response to said determination.

4. The method of claim 1 wherein:

said issuing step includes the step of sending an address of the value to an address decoder; and said accessing step includes the step of the address decoder selecting one of a plurality of word lines of the memory array based on the address.

5. The method of claim 1 wherein said issuing step issues a request to write the value to the memory array of the register file, and said checking step includes the steps of:

setting a latch to the value;

calculating a parity bit for the value in the latch; and storing the parity bit in a parity array.

6. The method of claim 5 wherein:

said issuing step includes the step of sending an address of the value to a write address decoder;

said accessing step includes the step of the write address decoder selecting one of a plurality of word lines of the memory array based on the address; and said checking step includes the step of the write address decoder selecting one of a plurality of entries in a parity memory array based on the address.

7. The method of claim 1 wherein said issuing step issues a request to read the value from the memory array of the register file, and said checking step includes the steps of:

setting a latch to the value;

calculating a first parity bit for the value in the latch; and comparing the first parity bit to a second parity bit previously stored in a parity array.

8. The method of claim 7 wherein:

said issuing step includes the step of sending an address of the value to a read address decoder;

said accessing step includes the step of the read address decoder selecting one of a plurality of word lines of the memory array based on the address; and said checking step includes the step of the read address decoder selecting one of a plurality of entries in a parity memory array based on the address.

9. A circuit for storing values used by a data processor, comprising:

array means for storing a plurality of values;

means for accessing a given value in said array means during a first clock cycle; and means for checking for errors in the given value during a second clock cycle immediately following the first clock cycle.

10. The circuit of claim 9 wherein said array means has a plurality of write ports, a plurality of read ports, a plurality of write select lines, and a plurality of read select lines.

11. The circuit of claim 10 wherein said accessing means includes a plurality of write decoders connected, respectively, to said plurality of write select lines, and a plurality of read decoders connected, respectively, to said plurality of read select lines.

12. The circuit of claim 11 wherein:

each of said write decoders has one input connected to a first system clock; and each of said read decoders has one input connected to a second system clock which is an inverted signal of said first system clock.

13. The circuit of claim 9 wherein said checking means includes a parity array having a plurality of single-bit entries corresponding, respectively, to entries of said array means.

14. The circuit of claim 9 wherein said checking means checks for errors in the given value during a first half of the second clock cycle.

15. The circuit of claim 9 wherein:
said accessing means writes the given value to the array means; and
said checking means sets a latch to the given value, and calculates a parity bit for the given value in the latch.

16. The circuit of claim 9 wherein:
said accessing means reads the given value from the array means; and
said checking means sets a latch to the given value, calculates a first parity bit for the value in the latch, and compares the first parity bit to a second parity bit previously stored in a parity array.

17. A register for a computer processor, having a delayed parity check, the register comprising:
a memory array having a plurality of entries for receiving values to be used by the computer processor, said memory array having a plurality of write ports, a plurality of read ports, a plurality of write select lines used to temporarily assign a given one of the write ports to a particular entry, and a plurality of read select lines used to temporarily assign a given one of the read ports to a particular entry;
a plurality of write decoders having outputs connected, respectively, to said write select lines of said memory array, each of said write decoders further having one input connected to a first system clock;
a plurality of read decoders having outputs connected, respectively, to said read select lines of said memory array, each of said read decoders further having one input connected to a second system clock which is an inverted signal of said first system clock;
a parity bit array having a plurality of single-bit entries, a plurality of write ports, a plurality of read ports, a plurality of write select lines used to temporarily assign a given one of the write ports to a particular entry in the parity bit array, and a plurality of read select lines used to temporarily assign a given one of the read ports to a particular entry in the parity bit array;
a plurality of write data latches each having an input connected, respectively, to said write ports of said memory array;
a first plurality of N-way XOR gates each having N inputs connected to a respective output of said write data latches, where N is a number of bits of a value stored in said memory array, said first plurality of N-way XOR gates further having outputs connected, respectively, to said write ports of said parity bit array;
a plurality of write address latches each having an input connected to a respective one of said write select lines of said memory array, and each having an output connected to a respective one of said write select lines of said parity bit array;
a plurality of read data latches each having an input connected, respectively, to said read ports of said memory array;
a second plurality of N-way XOR gates each having N inputs connected to a respective output of said read data latches;
a plurality of read address latches each having an input connected to a respective one of said read select lines of said memory array, and each having an output connected to a respective one of said read select lines of said parity bit array; and
a plurality of 2-way XOR gates, each having a first input connected to a respective output of said second plurality of N-way XOR gates, and having a second input connected to a respective one of said read ports of said parity bit array.

18. The register of claim 17 wherein:
said first system clock controls inputs of said write data latch and said write address latch, and controls outputs of said read data latch and said read address latch; and
said second system clock controls inputs of said read data latch and said read address latch, and controls outputs of said write data latch and said write address latch.

* * * * *